US011386322B1

(12) United States Patent
Ding et al.

(10) Patent No.: US 11,386,322 B1
(45) Date of Patent: *Jul. 12, 2022

(54) SYSTEM, METHOD, AND COMPUTER-PROGRAM PRODUCT FOR ROUTING IN AN ELECTRONIC DESIGN USING DEEP LEARNING

(71) Applicant: Cadence Design Systems, Inc., San Jose, CA (US)

(72) Inventors: Weibin Ding, Shanghai (CN); Jie Chen, Shanghai (CN); Chao Luo, Shanghai (CN); Xin-Lei Zhang, Shanghai (CN)

(73) Assignee: Cadence Design Systems, Inc., San Jose, CA (US)

( * ) Notice: Subject to any disclaimer, the term of this patent is extended or adjusted under 35 U.S.C. 154(b) by 571 days.

This patent is subject to a terminal disclaimer.

(21) Appl. No.: 15/278,304

(22) Filed: Sep. 28, 2016

(51) Int. Cl.
*G06N 3/08* (2006.01)
*G06F 30/00* (2020.01)

(52) U.S. Cl.
CPC .............. *G06N 3/08* (2013.01); *G06F 30/00* (2020.01)

(58) Field of Classification Search
CPC ................................ G06N 3/08; G06F 17/50
See application file for complete search history.

(56) References Cited

U.S. PATENT DOCUMENTS

| | | | | |
|---|---|---|---|---|
| 6,536,028 B1 * | 3/2003 | Katsioulas | .............. | G06F 30/39 716/125 |
| 6,907,591 B1 * | 6/2005 | Teig | .................... | G06F 17/5036 716/115 |
| 6,938,234 B1 * | 8/2005 | Teig | .................... | G06F 17/5077 716/129 |
| 7,322,019 B2 * | 1/2008 | Sato | ..................... | G06F 30/367 716/112 |
| 7,657,860 B1 * | 2/2010 | Brashears | ........... | G06F 17/5077 716/129 |
| 7,739,630 B1 * | 6/2010 | Chen | .................... | G06F 17/5068 716/136 |
| 8,782,570 B1 | 7/2014 | Li | | |

(Continued)

OTHER PUBLICATIONS

Jabri et al., Predicting the Number of Vias and Dimensions of Full-custom Circuits Using Neural Networks Techniques, 1991, IEEE, pp. 1-6 (Year: 1991).*

(Continued)

*Primary Examiner* — Kakali Chaki
*Assistant Examiner* — Kevin L. Smith
(74) *Attorney, Agent, or Firm* — Mark H. Whittenberger, Esq.; Holland & Knight LLP

(57) ABSTRACT

The present disclosure relates to a computer-implemented method for routing in an electronic design. Embodiments may include receiving, using at least one processor, global route data associated with an electronic design as an input and generating detail route data, based upon, at least in part, the global route data. Embodiments may further include transforming one or more of the detail route data and the global route data into at least one input feature and at least one output result of a deep neural network. Embodiments may also include training the deep neural network with the global route data and the detail route data and predicting an output associated with a detail route based upon, at least in part, a trained deep neural network model.

17 Claims, 5 Drawing Sheets

(56) References Cited

U.S. PATENT DOCUMENTS

| | | |
|---|---|---|
| 2003/0014725 A1 | 1/2003 | Sato |
| 2006/0156266 A1 | 7/2006 | Alpert |
| 2009/0031275 A1 | 1/2009 | Cho |
| 2009/0144688 A1* | 6/2009 | Uchino .............. G06F 30/394 716/126 |
| 2013/0159943 A1* | 6/2013 | Agarwal ............ G03F 7/70433 716/52 |
| 2016/0085898 A1 | 3/2016 | Monohar |

OTHER PUBLICATIONS

Chu et al., "Context-aware Post Routing Redundant via Insertion," 2009, IEEE, pp. 37-42 (Year: 2009).*

Zhou et al., "An Accurate Detailed Routing Routabilty Prediction Model in Placement," 2015, IEEE, pp. 119-122 (Year: 2015).*

Chu et al., "Context-Aware Post Routing Redundant via Insertion," (IEEE 2009) (Year: 2009).*

Zhou et al., "An Accurate Detaed Routing Routability Prediction Model in Placement," (IEEE 2015) (Year: 2015).*

Matsunawa et al., "Automatic Layout Feature Extraction for Lithography Hotspot Detection based on Deep Neural Network," SPIE Advanced Lithography (Mar. 16, 2016) (Year: 2016).*

Jurjen Westra, "Congestion Analysis and Management," Thesis (2009) (Year: 2009).*

Taghavi et al., "New Placement Prediction and Mitigation Techniques for Local Routing Congestion" (IEEE 2010) (Year: 2010).*

Virtuoso Space-based Router User Guide, Product Version 6.1.5 (Cadence, Jan. 2011) (Year: 2011).*

Wang et al., "Data Mining in EDA—Basic Principles, Promises, and Constraints," ACM (2014) (Year: 2014).*

The Authoritative Dictionarey of IEEE Standard Terms, pp. 1143-1144 (7th ed. 2000) (Year: 2000).

Cho et al., "BoxRouter 2.0: Architecture and Implementation of a Hybrid and Robust Global Router," IEEE (2007) (Year: 2007).

* cited by examiner

SYSTEM, METHOD, AND COMPUTER-PROGRAM PRODUCT FOR ROUTING IN AN ELECTRONIC DESIGN USING DEEP LEARNING

FIELD OF THE INVENTION

The present disclosure relates to electronic design verification, and more specifically, to a method for routing in an electronic design.

DISCUSSION OF THE RELATED ART

In the electronic design automation ("EDA") field at certain advanced nodes, there may be a deep conflict between power, performance, and area ("PPA") and design turnaround time ("TAT"). New physical and electrical design challenges emerge, and structures such as Fin Field Effect Transistors ("FinFETs") create new considerations. To remain competitive, a user cannot afford to make any tradeoffs to either PPA or TAT. Some physical implementation tools for high-density designs at advanced and established process nodes may be configured to deliver a typical 10%-20% PPA advantage along with an up to 10×TAT gain. Some of these tools may be configured to provide a massively parallel solution, and as such, may effectively handle blocks as large as 5-10 million instances or more. These tools may be configured to provide new capabilities in placement, optimization, routing, and clocking. Their unique architecture accounts for upstream and downstream steps and effects in the design flow to minimize design iterations and provide a runtime boost.

SUMMARY OF DISCLOSURE

In one or more embodiments of the present disclosure, a computer-implemented method for routing in an electronic design is provided. The method may include receiving, using at least one processor, global route data associated with an electronic design as an input and generating detail route data, based upon, at least in part, the global route data. The method may also include transforming one or more of the detail route data and the global route data into at least one input feature and at least one output result of a deep neural network and training the deep neural network with the global route data and the detail route data. The method may further include predicting an output associated with a detail route based upon, at least in part, a trained deep neural network model.

One or more of the following features may be included. In some embodiments, predicting an output may include predicting a wire length for at least one net associated with the electronic design. In some embodiments, predicting an output may include predicting a via number for at least one net associated with the electronic design. In some embodiments, the via number may include a double cut via ratio. The global route data may include at least one of a pin-to-pin connection, a net wire segment, a pin location shape, a blockage location, a blockage shape, a standard pitch of a design, and a pre-routed net. The method may include transforming the global route data into one or more input features of the deep neural network during a testing stage. In some embodiments, the deep neural network may be based upon, at least in part, one or more of post-route physical layout information, an input feature set, an output feature set, and a neural network framework.

In one or more embodiments of the present disclosure a computer-readable storage medium having stored thereon instructions, which when executed by a processor result in one or more operations is provided. Operations may include receiving, using at least one processor, global route data associated with an electronic design as an input and generating detail route data, based upon, at least in part, the global route data. Operations may also include transforming one or more of the detail route data and the global route data into at least one input feature and at least one output result of a deep neural network and training the deep neural network with the global route data and the detail route data. Operations may further include predicting an output associated with a detail route based upon, at least in part, a trained deep neural network model.

One or more of the following features may be included. In some embodiments, predicting an output may include predicting a wire length for at least one net associated with the electronic design. In some embodiments, predicting an output may include predicting a via number for at least one net associated with the electronic design. In some embodiments, the via number may include a double cut via ratio. The global route data may include at least one of a pin-to-pin connection, a net wire segment, a pin location shape, a blockage location, a blockage shape, a standard pitch of a design, and a pre-routed net. Operations may include transforming the global route data into one or more input features of the deep neural network during a testing stage. In some embodiments, the deep neural network may be based upon, at least in part, one or more of post-route physical layout information, an input feature set, an output feature set, and a neural network framework.

In one or more embodiments of the present disclosure, a system for routing in an electronic design is provided. The system may include one or more processors configured to receive global route data associated with an electronic design as an input. The at least one processor may be further configured to generate detail route data, based upon, at least in part, the global route data. The at least one processor may be further configured to transform one or more of the detail route data and the global route data into at least one input feature and at least one output result of a deep neural network. The at least one processor may be further configured to train the deep neural network with the global route data and the detail route data. The at least one processor may be further configured to predict an output associated with a detail route based upon, at least in part, a trained deep neural network model.

One or more of the following features may be included. In some embodiments, predicting an output includes predicting a wire length for at least one net associated with the electronic design. Predicting an output may include predicting a via number for at least one net associated with the electronic design. In some embodiments, the via number may include a double cut via ratio. The global route data may include at least one of a pin-to-pin connection, a net wire segment, a pin location shape, a blockage location, a blockage shape, a standard pitch of a design, and a pre-routed net. The at least one processor may be further configured to transform the global route data into one or more input features of the deep neural network during a testing stage.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
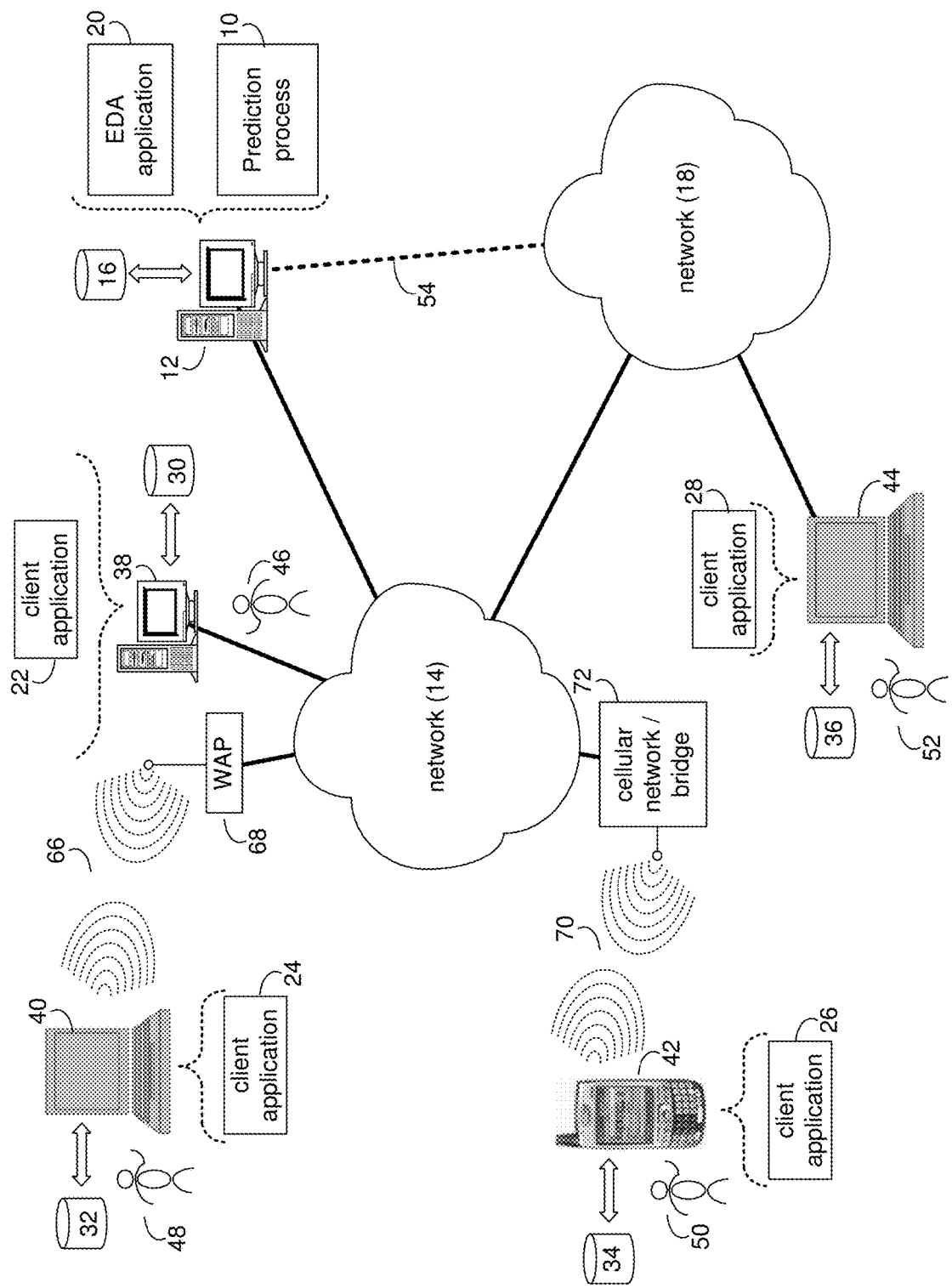
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As used herein the phrase "global routing" may refer to the routing phase used to determine a general or rough route on a chip for each net. This phase may be configured to handle the majority of resource conflicts. The phrase "detail routing", as used herein, may refer to the routing phase following global routing. This may include mapping the global route into the real wire resources on the chip. In this phase, the real wire topology may be determined and all wire widths, layer, via, and contact choices may be made. The phrase "pre-route" may refer to the status prior to the global routing phase.

Embodiments of the prediction process described herein may be used in a variety of different techniques. Some of these may include, but are not limited to, utilizing deep learning to predict resistance/capacitance ("RC") parasitic parameter and congestion from the pre-route stage to the global route stage and on to the detail route stage.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Referring to FIG. 1, there is shown a prediction process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, prediction process 10 may reside on and be executed, in whole or in part, by a client electronic device, such as a personal computer, notebook computer, personal digital assistant, or the like.

The instruction sets and subroutines of prediction process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Prediction process 10 may be a stand alone application, or may be an applet/application/script that may interact with and/or be executed within EDA application 20. In addition/as an alternative to being a server-side process, prediction process 10 may be a client-side process (not shown) that may reside on a client electronic device (described below) and may interact with an EDA client application (e.g., one or more of EDA client applications 22, 24, 26, 28). Further, prediction process 10 may be a hybrid server-side/client-side process that may interact with EDA application 20 and an EDA client application (e.g., one or more of client applications 22, 24, 26, 28). As such, prediction process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize prediction process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
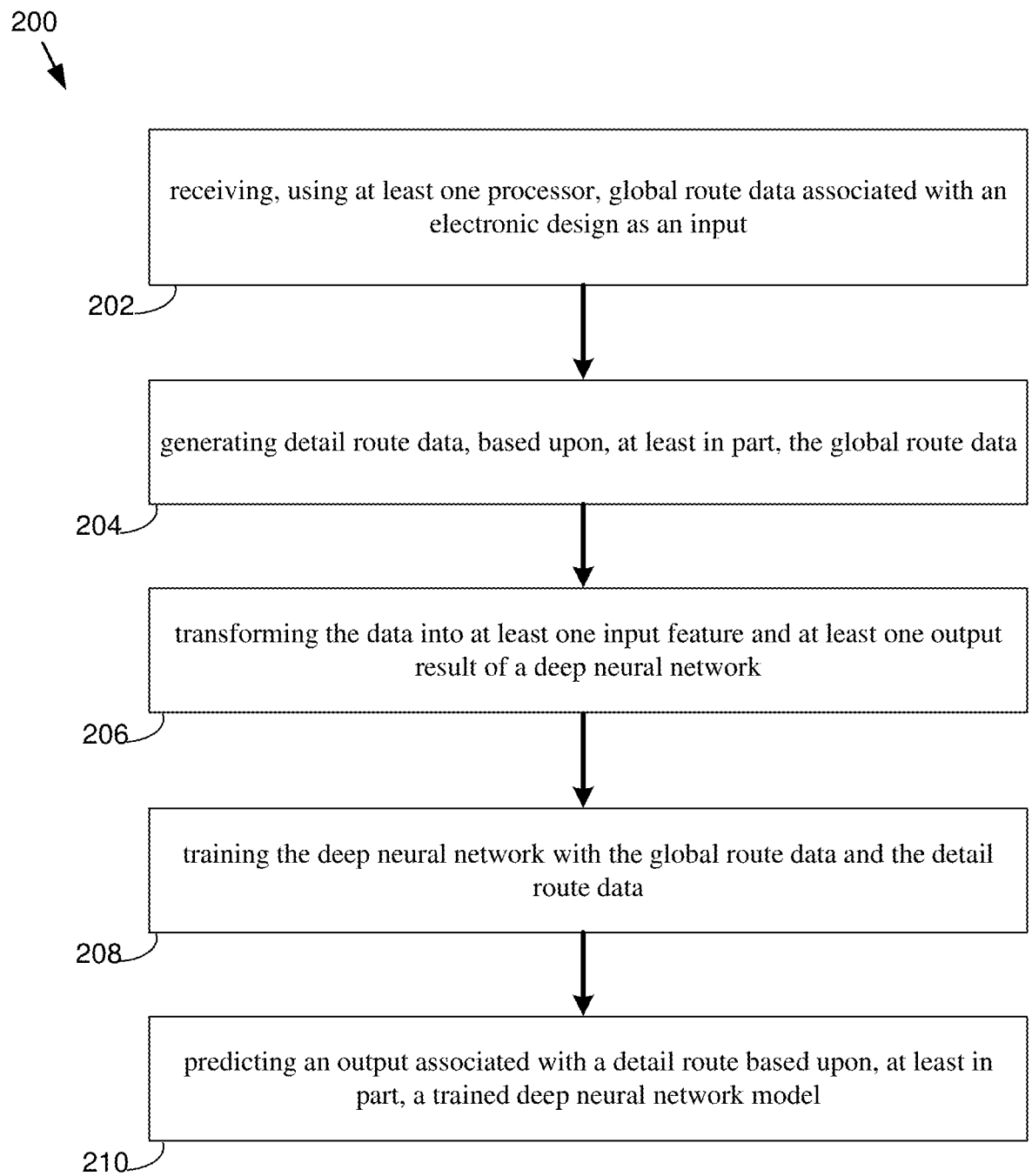
FIG. 2 is a flowchart depicting operations consistent with the prediction process in accordance with an embodiment of the present disclosure.

Referring now to FIG. 2, an exemplary flowchart 200 depicting operations consistent with prediction process 10 is provided. Operations may include receiving (202), using at least one processor, global route data associated with an electronic design as an input and generating (204) detail route data, based upon, at least in part, the global route data. The method may also include transforming (206) one or more of the detail route data and the global route data into at least one input feature and at least one output result of a deep neural network and training (208) the deep neural network with the global route data and the detail route data. The method may further include predicting (210) an output associated with a detail route based upon, at least in part, a trained deep neural network model.

Embodiments of prediction process 10 may configured to address the pre-route to post-route timing and congestion correlation, which may be critical for certain EDA place and route tools. In existing tools, it may be difficult to predict the post-route timing and design-rule-check ("DRC") before running through the detail route step. Accordingly, it is generally too expensive to run the detail route to estimate. In existing tools, there are multiple ways to estimate the detail route net topology including vias. Typically, this may include characterizing the net distance plus heuristic to approximate the detail route net. Due to its accuracy, it will need some refinement factor (e.g., the number usually from testing at different case) to improve the final correlation. Since performing the detail route calculation is time consuming, it may be expensive to run the detail route to obtain the timing and DRC at the pre-route stage. In existing tools, estimation is the only way to predict detail route timing and DRC.

Accordingly, embodiments of the present disclosure include an approach to use a deep learning method to predict post-route RC parasitic parameter and congestion at the pre-route and/or global route stage. In this way, the results generated by prediction process 10 show promising improvement of post-route timing closure and DRC closure.

In some embodiments, for any specific process node (e.g., TSMC 10 nm), the detail routing algorithm used may be deterministic. Embodiments of prediction process 10 may view the detail routing algorithm as a mathematic function, which inputs are the known information for each net at pre-route stage, and which outputs are all the nets topology. Accordingly, embodiments of prediction process 10 may utilize a neural network to approximate the function. In this way, if the proper information is selected as the features of the neural network and enough samples as training data, the trained neural network may not only approximate the function for the nets inside the training set, but also may be used to generalize to other nets outside the training set.

In some embodiments, at the global route stage, the input data format may include a variety of different types. Some of these may include, but are not limited to, a Net connection and/or pin-to-pin connection, a Net segment and/or net wire segment, a Pin and/or pin location shape, a Blockage and/or a blockage location and shape, a STD PITCH and/or the standard pitch of design, and an existing shape and/or pre-routed net.

In some embodiments, at the detail route stage, the output data format may include a variety of different types. Some of these may include, but are not limited to, a wire length for one or more nets, a via number (e.g., with double cut via ratio) for one or more nets, etc.

In some embodiments, prediction process 10 may utilize a deep learning method to train a neural network to serve the purpose of RC and congestion estimation before the detail route. After massive training, the prediction accuracy is much higher than conventional method. Accordingly, embodiments of prediction process 10 may use a deep learning method for massive training of test cases, which may provide a higher estimation accuracy than certain heuristic.

Figure 3:
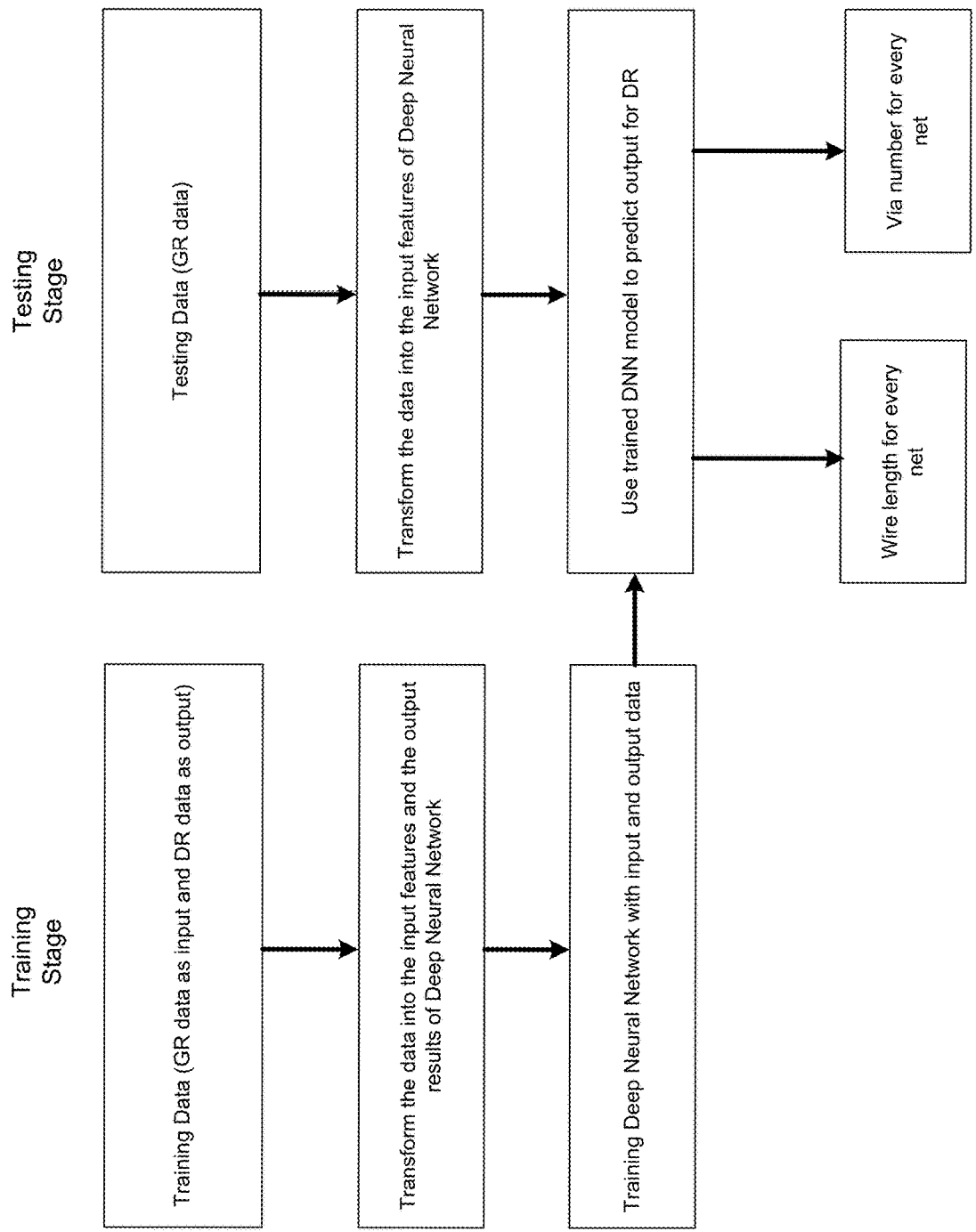
FIG. 3 is a flowchart depicting operations consistent with the prediction process in accordance with an embodiment of the present disclosure.

Referring now to FIG. 3, an embodiment depicting an example of prediction process 10 is provided. In this particular example, one particular deep learning example is provided. As shown in the diagram the process may include both a training and a testing stage. In the training stage, training data may be received (e.g., global route data as input and detail route data as output). The process may include transforming the data into the input features and the output results of Deep Neural Network and subsequently training the deep neural network with input and output data. Since the neural network only can handle vectors of a numeric type, the teachings of the present disclosure may be used to transform the data of complex data types generated by a related EDA application into vectors of a numeric type.

Therefore, the feature data which the neural network requires, may be generated. Once the input data and the corresponding output data has been obtained, a training set is generated. Based on this training set, prediction process 10 may be configured to train a neural network. After the neural network is trained, it can take an input data from the train set as input and predict an output. This output will be a good approximation of its corresponding output data in the training set.

In the testing stage, the testing data may be received (e.g., global route data). The process may include transforming the data into the input features of a deep neural network. In some embodiments, a trained DNN model may be used to predict the output for the detail route. The output may include, but is not limited to, the wire length for every net and/or the via number for every net.

Figure 4:
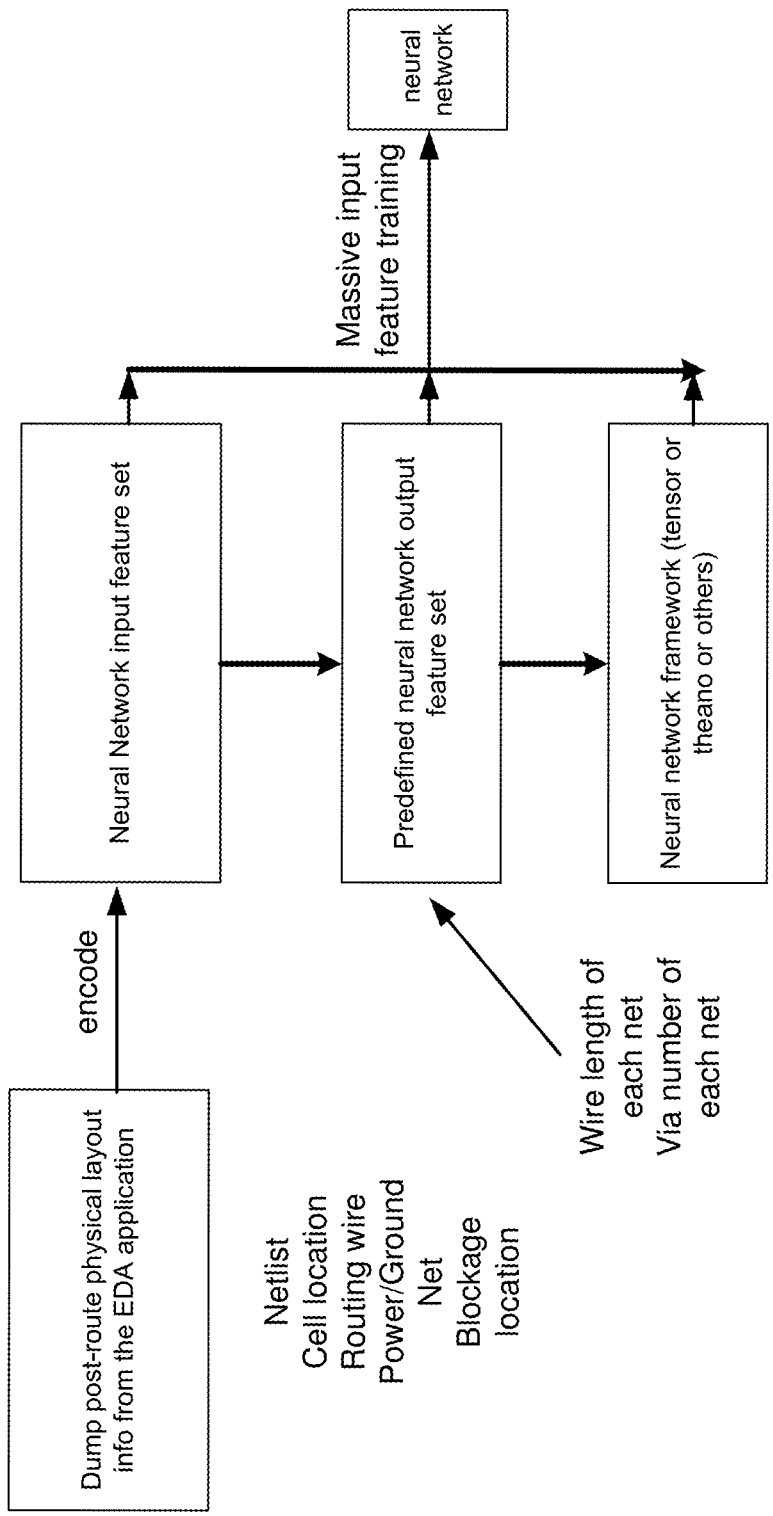
FIG. 4 is a flowchart depicting operations consistent with the prediction process in accordance with an embodiment of the present disclosure.

FIG. 4 depicts an embodiment of prediction process 10 showing an example technique for obtaining a neural network. In some embodiments, post-route physical layout information from the EDA application may be received. Some of this information may include, but is not limited to, netlist, cell location, routing wire, power/Ground, net, blockage location, etc. Some or all of this information may be encoded to generate a neural network input feature set. A predefined neural network output feature set may also be generated. This may include, but is not limited to, wire length of each net and/or the via number of each net. This information may be combined with a neural network framework in order to generate a massive input feature training set, which may be used to generate the neural network.

Figure 5:
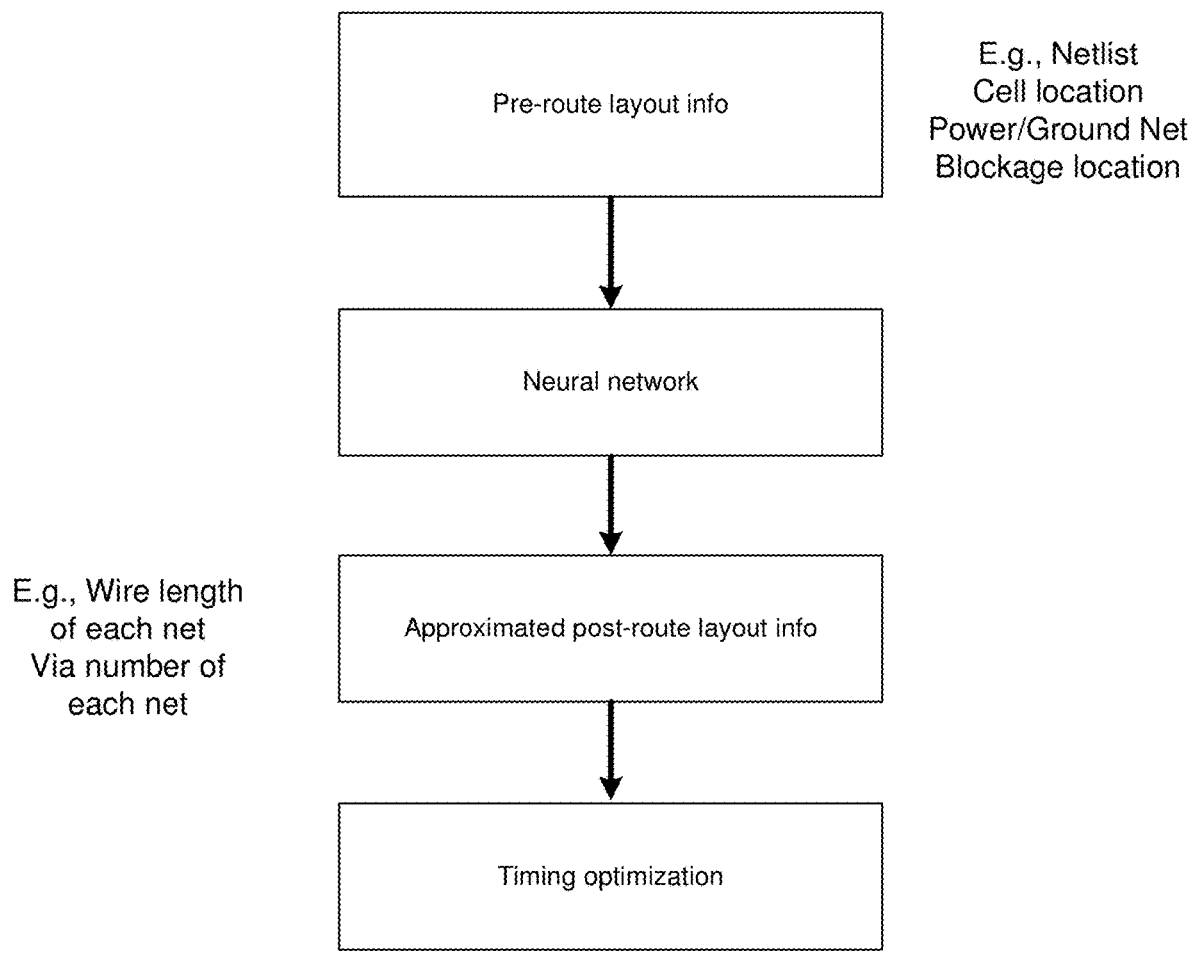
FIG. 5 is a flowchart depicting operations consistent with the prediction process in accordance with an embodiment of the present disclosure.

Referring again to FIG. 5, an embodiment of prediction process 10 showing an example use of the neural network is provided. In this example, the neural network may be used in an EDA application such as those available from the Assignee of the subject application. In this particular example, pre-route layout information, which may include, but is not limited to, netlist, cell location, power/ground net, and blockage location may be received at the EDA application. The neural network, which may include, the wire length of each net and/or the via number of each net may then be applied. Approximated post-route layout information may be generated prior to timing optimization.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for routing in an electronic design comprising:
   receiving, using at least one processor, global route data associated with the electronic design as an input;
   generating detail route data, based upon the global route data, wherein the global route data includes a pin location shape, a standard pitch of a design, a pin-to-pin connection, a blockage location, a blockage shape, and a pre-routed net;
   receiving at least one of a post-route physical layout information and a pre-route physical layout information, wherein the at least one of the post-route physical layout information and the pre-route physical layout information includes at least one of a netlist, a cell location, a routing wire, and a power/ground net;
   transforming one or more of the detail route data, the global route data, the post-route physical layout information, and the pre-route physical layout information into one or more numerical vectors including at least one input feature and at least one output result of a deep neural network;
   training, based upon at least in part, the one or more numerical vectors, the deep neural network with one or more of the global route data, the detail route data, the post-route physical layout information, and the pre-route physical layout information; and
   predicting post-route resistance and capacitance ("RC") parasitic parameter and congestion information prior to routing, wherein predicting includes predicting an output associated with a detail route based upon, at least in part, a trained deep neural network model, wherein predicting an output includes predicting a wire length or a via number for all nets associated with the electronic design.

2. The computer-implemented method of claim 1, wherein the via number includes a double cut via ratio.

3. The computer-implemented method of claim 1, further comprising:
   transforming the global route data into one or more input features of the deep neural network during a testing stage.

4. The computer-implemented method of claim 1, wherein the deep neural network is based upon, at least in part, one or more of post-route physical layout information, an input feature set, an output feature set, and a neural network framework.

5. A non-transitory computer-readable storage medium for routing in an electronic design, the computer-readable storage medium having stored thereon instructions that when executed by a machine result in one or more operations, the operations comprising:
   receiving, using at least one processor, global route data associated with the electronic design as an input;
   generating detail route data, based upon the global route data, wherein the global route data includes a pin location shape, a standard pitch of a design, a pin-to-pin connection, a blockage location, a blockage shape, and a pre-routed net;
   receiving at least one of a post-route physical layout information and a pre-route physical layout information, wherein the at least one of the post-route physical layout information and the pre-route physical layout information includes a routing wire and a power/ground net;
   transforming one or more of the detail route data, the global route data, the post-route physical layout information, and the pre-route physical layout information into one or more numerical vectors including at least one input feature and at least one output result of a deep neural network;
   training, based upon at least in part, the one or more numerical vectors, the deep neural network with one or more of the global route data, the detail route data, the post-route physical layout information, and the pre-route physical layout information, wherein the neural network is configured to approximate a mathematic function corresponding to a detail routing algorithm; and
   predicting post-route resistance and capacitance ("RC") parasitic parameter and congestion information prior to routing, wherein predicting includes predicting an output associated with a detail route based upon, at least in part, a trained deep neural network model, wherein predicting an output includes predicting a wire length or a via number for at least one net associated with the electronic design.

6. The computer-readable storage medium of claim 5, wherein the via number includes a double cut via ratio.

7. The computer-readable storage medium of claim 5, further comprising:
transforming the global route data into one or more input features of the deep neural network during a testing stage.

8. The computer-readable storage medium of claim 5, wherein the deep neural network is based upon, at least in part, one or more of post-route physical layout information, an input feature set, an output feature set, and a neural network framework.

9. A system for routing in an electronic design comprising:
a computing device having at least one processor configured to receive global route data associated with the electronic design as an input, the at least one processor further configured to generate detail route data, based upon the global route data, wherein the global route data includes a pin location shape, a standard pitch of a design, a pin-to-pin connection, and a pre-routed net, the at least one processor further configured to receive at least one of a post-route physical layout information and a pre-route physical layout information, wherein the at least one of the post-route physical layout information and the pre-route physical layout information includes at least one of a netlist, a cell location, a routing wire, and a power/ground net, the at least one processor further configured to transform one or more of the detail route data, the global route data, the post-route physical layout information, and the pre-route physical layout information into one or more numerical vectors including at least one input feature and at least one output result of a deep neural network, the at least one processor further configured to train, based upon at least in part, the one or more numerical vectors, the deep neural network with the global route data and the detail route data, the at least one processor further configured to predict post-route resistance and capacitance ("RC") parasitic parameter and congestion information prior to routing, wherein predicting includes predicting an output associated with a detail route based upon, at least in part, a trained deep neural network model, wherein predicting an output includes predicting a wire length and or a via number for at least one net associated with the electronic design.

10. The system of claim 9, wherein the via number includes a double cut via ratio.

11. The system of claim 9, wherein the at least one processor is further configured to transform the global route data into one or more input features of the deep neural network during a testing stage.

12. The computer-implemented method of claim 1, wherein predicting an output includes predicting a post-route resistance/capacitance parasitic parameter for at least one net associated with the electronic design.

13. The computer-implemented method of claim 1, wherein predicting an output includes predicting at least one of a congestion at a pre-route stage and a congestion at a global route stage for at least one net associated with the electronic design.

14. The computer-readable storage medium of claim 5, wherein predicting an output includes predicting a post-route parasitic parameter for at least one net associated with the electronic design.

15. The computer-readable storage medium of claim 5, wherein predicting an output includes predicting at least one of a congestion at a pre-route stage and a congestion at a global route stage for at least one net associated with the electronic design.

16. The system of claim 9, wherein the output includes predicting a post-route parasitic parameter for at least one net associated with the electronic design.

17. The system of claim 9, wherein the output includes predicting at least one of a congestion at a pre-route stage and a congestion at a global route stage for at least one net associated with the electronic design.

* * * * *